United States Patent
Jung et al.

(10) Patent No.: US 10,950,620 B2
(45) Date of Patent: Mar. 16, 2021

(54) VERTICAL-TYPE MEMORY DEVICE

(71) Applicant: Samsung Electronics Co., Ltd., Suwon-si (KR)

(72) Inventors: Kwang Young Jung, Hwaseong-si (KR); Dong Won Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/242,410

(22) Filed: Jan. 8, 2019

(65) Prior Publication Data

US 2019/0326318 A1    Oct. 24, 2019

(30) Foreign Application Priority Data

Apr. 20, 2018  (KR) .......................... 10-2018-0045979

(51) Int. Cl.
| | |
|---|---|
| *H01L 27/11582* | (2017.01) |
| *H01L 27/11565* | (2017.01) |
| *H01L 27/11573* | (2017.01) |
| *H01L 27/1157* | (2017.01) |
| *H01L 29/423* | (2006.01) |

(52) U.S. Cl.
CPC .... *H01L 27/11582* (2013.01); *H01L 27/1157* (2013.01); *H01L 27/11565* (2013.01); *H01L 27/11573* (2013.01); *H01L 29/4234* (2013.01)

(58) Field of Classification Search
CPC .............. H01L 27/11556; H01L 27/11582
See application file for complete search history.

(56) References Cited

U.S. PATENT DOCUMENTS

| | | | |
|---|---|---|---|
| 2012/0193705 A1* | 8/2012 | Lim | H01L 27/11575 257/330 |
| 2014/0210012 A1* | 7/2014 | Fang | H01L 27/11573 257/369 |
| 2015/0236038 A1* | 8/2015 | Pachamuthu | H01L 27/11524 257/326 |
| 2015/0340376 A1 | 11/2015 | Park et al. | |
| 2016/0027796 A1* | 1/2016 | Yang | H01L 27/11573 257/314 |
| 2016/0049423 A1 | 2/2016 | Yoo et al. | |
| 2016/0225785 A1 | 8/2016 | Kim et al. | |
| 2017/0040337 A1 | 2/2017 | Kim et al. | |

(Continued)

FOREIGN PATENT DOCUMENTS

| | | |
|---|---|---|
| KR | 10-2015-0133914 A | 12/2015 |
| KR | 10-2016-0020019 A | 2/2016 |

(Continued)

*Primary Examiner* — Moazzam Hossain
(74) *Attorney, Agent, or Firm* — Harness, Dickey & Pierce, P.L.C.

(57) ABSTRACT

A vertical-type memory device a vertical-type memory device comprising a substrate including a first region and a second region, adjacent to the first region, a first conductive layer extending on the first region and the second region, and a second conductive layer extending on the first region and the second region, the second conductive layer stacked on the first conductive layer. An upper surface of the substrate has a step portion at a boundary between the first region and the second region, and the upper surface of the substrate in the first region is lower than in the second region.

7 Claims, 17 Drawing Sheets

(56) References Cited

U.S. PATENT DOCUMENTS

| | | |
|---|---|---|
| 2017/0092654 A1 | 3/2017 | Nishikawa et al. |
| 2017/0170191 A1 | 6/2017 | Lee et al. |
| 2017/0236835 A1 | 8/2017 | Nakamura et al. |
| 2018/0151583 A1* | 5/2018 | Lupino .............. H01L 27/11556 |
| 2019/0035798 A1* | 1/2019 | Hwang ............... H01L 29/0649 |
| 2019/0035808 A1 | 1/2019 | Jung et al. |
| 2019/0139974 A1* | 5/2019 | Sugawara ......... H01L 27/11556 |

FOREIGN PATENT DOCUMENTS

| | | |
|---|---|---|
| KR | 10-2016-0094827 A | 8/2016 |
| KR | 10-2017-0018207 A | 2/2017 |
| KR | 10-2017-0070355 A | 6/2017 |
| KR | 10-2019-0011870 A | 2/2019 |

* cited by examiner

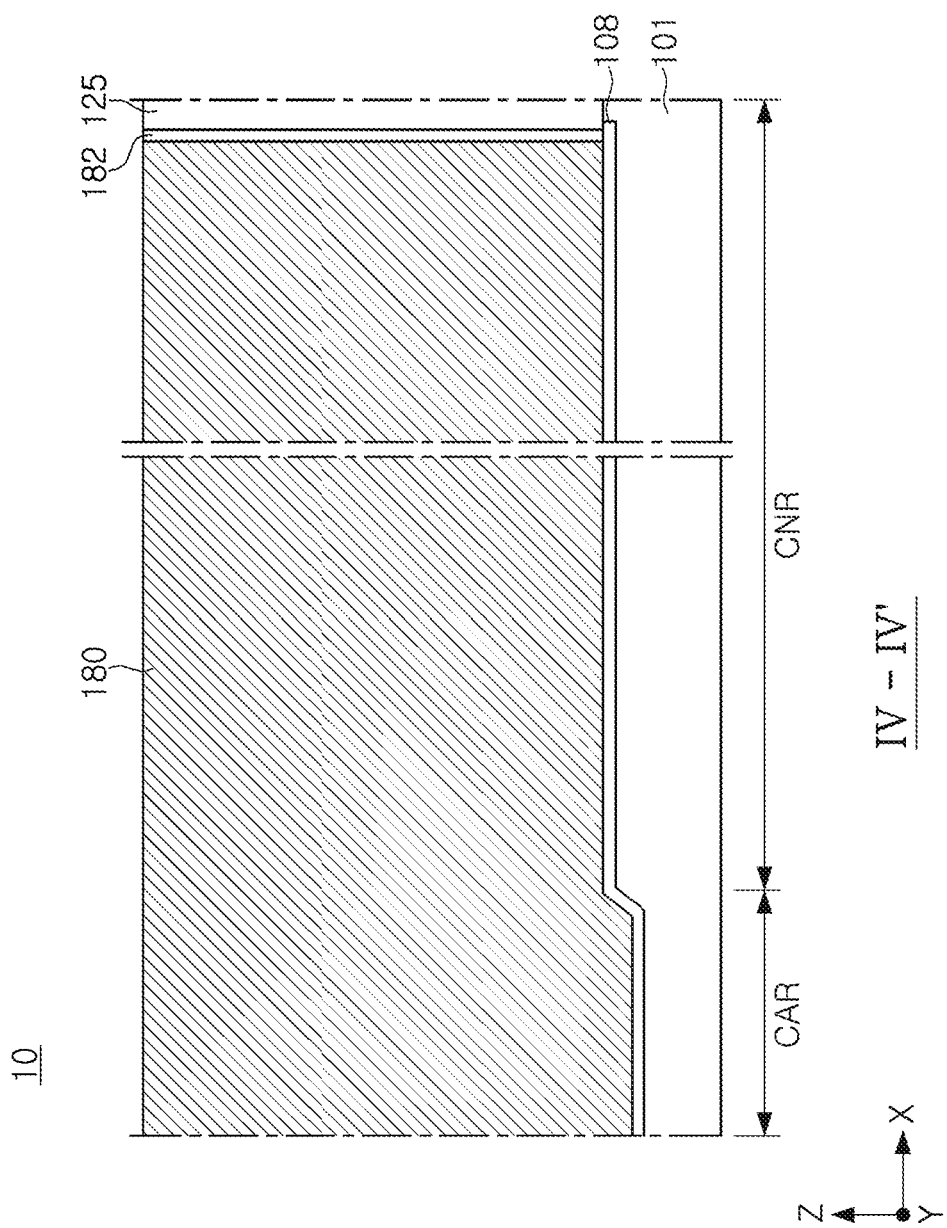

VERTICAL-TYPE MEMORY DEVICE

CROSS-REFERENCE TO RELATED APPLICATION(S)

This application claims priority to Korean Patent Application No. 10-2018-0045979 filed on Apr. 20, 2018 in the Korean Intellectual Property Office, the disclosure of which is incorporated by reference herein in its entirety.

BACKGROUND

Inventive concepts relate to a vertical-type memory device.

The size of electronic products have gradually been reduced, while such electronic products are maintain a requirement to process high capacity data. Thus, a degree of integration of semiconductor memory devices used in such electronic products is increased. In a method in which the degree of integration of semiconductor memory devices may be increased, a vertical-type memory device has been proposed, in which memory cells having a vertical transistor structure, rather than an existing planar transistor structure, are stacked.

SUMMARY

Some example embodiments of inventive concepts is to provide a vertical-type memory device having improved reliability.

According to some example embodiments of inventive concepts, a vertical-type memory device includes a substrate including a first region and a second region, adjacent to the first region, a first conductive layer extending on the first region and the second region, and a second conductive layer extending on the first region and the second region, the second conductive layer stacked on the first conductive layer. An upper surface of the substrate has a step portion at a boundary between the first region and the second region, and the upper surface of the substrate in the first region is lower than in the second region.

According to some example embodiments of inventive concepts, a vertical-type memory device includes a substrate including a cell array region and a connection region adjacent to the cell array region, a plurality of gate electrode layers stacked on the cell array region and the connection region of the substrate, and forming a stepped structure in the connection region, a plurality of channel structures in the cell array region, the plurality of channel structures passing through the plurality of gate electrode layers, and a plurality of dummy channel structures in the connection region, the plurality of dummy channel structures passing through at least one of the plurality of gate electrode layers. An upper surface of the substrate has a step portion at a boundary between the cell array region and the connection region. A vertical length of the plurality of channel structures is greater than a vertical length of the plurality of dummy channel structures.

According to some example embodiments of inventive concepts, a vertical-type memory device includes a vertical-type memory device comprising a substrate including a cell array region and a connection region adjacent to the cell array region, a plurality of gate electrode layers stacked on the cell array region and the connection region of the substrate, a lowermost one among the plurality of gate electrode layers forming a stepped structure in the connection region, a plurality of channel structures in the cell array region, and passing through the plurality of gate electrode layers, and a plurality of dummy channel structures in the connection region, and passing through at least one of the plurality of gate electrode layers. An upper surface of the substrate has a step portion at a boundary between the cell array region and the connection region. Each of the plurality of channel structures includes a first epitaxial layer in contact with the substrate, each of the plurality of dummy channel structures includes a second epitaxial layer in contact with the substrate, and a height of an upper surface of the first epitaxial layer is different from a height of an upper surface of the second epitaxial layer.

BRIEF DESCRIPTION OF DRAWINGS

The above and other aspects, features, and advantages of the present disclosure will be more clearly understood from the following detailed description, taken in conjunction with the accompanying drawings, in which:

FIGS. 4 to 6 are schematic cross-sectional views of a vertical-type memory device according to some example embodiments of inventive concepts;

DETAILED DESCRIPTION

Hereinafter, example embodiments of inventive concepts will be described with reference to the accompanying drawings.

Figure 1:
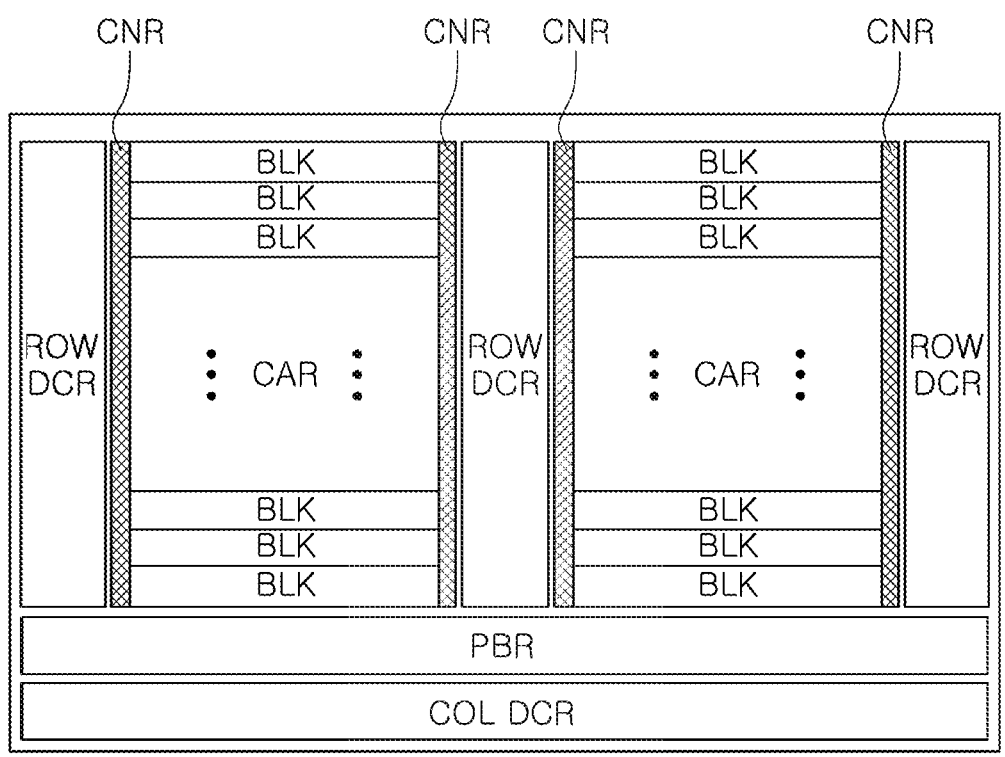
FIG. 1 is a schematic drawing illustrating a configuration of a vertical-type memory device according to some example embodiments of inventive concepts.

FIG. 1 is a schematic drawing of a vertical-type memory device according to some example embodiments.

Referring to FIG. 1, the vertical-type memory device may include a memory cell region and a peripheral circuit region. The peripheral circuit region may include row decoder regions ROW DCR, a page buffer region PBR, a column decoder region COL DCR, and the like. The memory cell region may include a cell array region CAR and a connection region CNR. According to example embodiments, the connection region CNR may be between the cell array region CAR and the row decoder regions ROW DCR.

A memory cell array comprised of a plurality of memory cells may be in the cell array region CAR. In example embodiments, the memory cell array may include memory cells arranged in a three dimensional manner, and a plurality of word lines and bit lines electrically connected to the memory cells.

A row decoder selecting the word lines of the memory cell array may be in the row decoder region ROW DCR, and a wiring structure including contact plugs and wirings, electrically connecting the memory cell array and the row decoder to each other, may be in the connection region CNR. The row decoder may select one of the word lines of the memory cell array by address information. The row decoder may provide a word line voltage to a selected word line and unselected word lines, respectively, in response to a control signal of a control circuit.

A page buffer may be in the page buffer region PBR, to read information stored in the memory cells. The page buffer may temporarily store data to be stored in the memory cells, or may sense data having been stored in the memory cells, depending on an operation mode. The page buffer may operate as a write driver circuit in a program operation mode, and may operate as a sense amplifier circuit in a read operation mode.

A column decoder, connected to bit lines of the memory array, may be in the column decoder region COL DCR. The column decoder may provide a data transmission path between the page buffer and an external device, for example, a memory controller.

The cell array region CAR may include a plurality of cell array blocks BLK. Each of the cell array blocks BLK may include gate electrode layers stacked on a substrate, and channel structures including a channel and a gate dielectric layer, to constitute three-dimensionally arranged memory cells. The gate electrode layers may be conductive. The gate electrode layers may include a conductive layer. Each of the cell array blocks BLK may include bit lines electrically connected to the memory cells.

Figure 2:
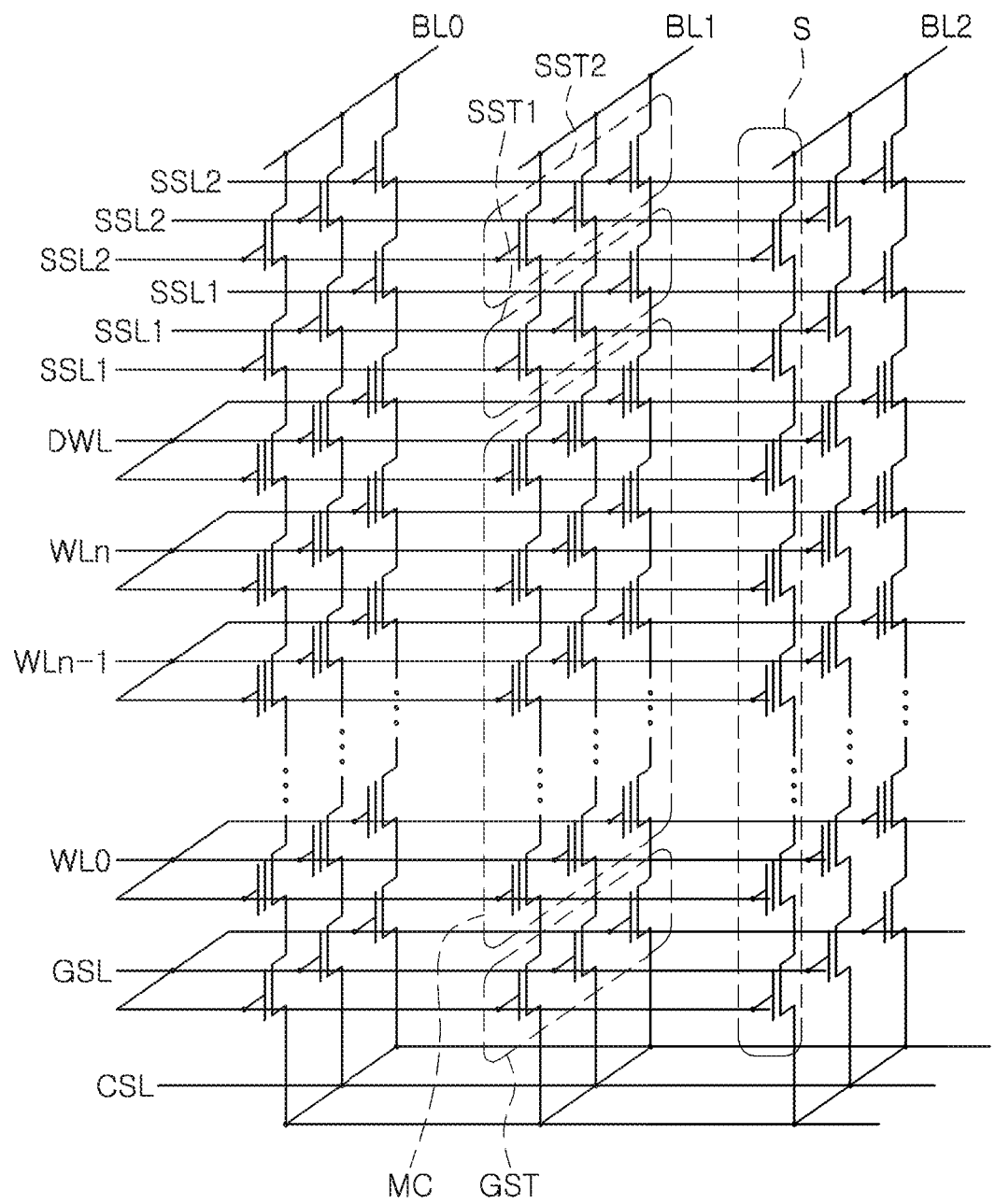
FIG. 2 is a circuit diagram conceptually illustrating a cell array region of FIG. 1.

FIG. 2 is a circuit diagram conceptually illustrating the cell array region CAR of FIG. 1.

Referring to FIG. 2, the memory cell array in the cell array region CAR may include a plurality of memory cell strings S, including memory cells MC, connected to each other in series, and a ground select transistor GST and string select transistors SST1 and SST2 connected to both ends of the memory cells MC in series. The plurality of memory cell strings S may be connected to respective bit lines BL0 to BL2 in parallel. The plurality of memory cell strings S may be connected to a common source line CSL in common. For example, the plurality of memory cell strings S may be between the plurality of bit lines BL0 to BL2 and one common source line CSL. In some example embodiments, a plurality of common source lines CSL may also be arranged in a two dimensional manner.

The memory cells MC, connected to each other in series, may be controlled by word lines WL0 to WLn to select the memory cells MC. Each of the memory cells MC may include a data storage element. Gate electrodes of the memory cells MC substantially at the same distance from the common source line CSL may be connected to one of the word lines WL0 to WLn in common, to be in an equipotential state. Likewise, although the gate electrodes of the memory cells MC are at substantially the same distance from the common source lines CSL, the gate electrodes arranged in different rows or columns may also be independently controlled.

The ground select transistor GST may be controlled by a ground select line GSL, and may be connected to the common source line CSL. A string select transistor SST may be controlled by string select lines SSL1 and SSL2, and may be connected to the bit lines BL0 to BL2. Although FIG. 2 illustrates a structure in which one ground select transistor GST and two string select transistors SST1 and SST2 are connected to the plurality of memory cells MC, connected in series, one ground select transistor GST and one string select transistor SST1 or SST2 may be connected thereto or a plurality of ground select transistors GST may also be connected thereto. One or more dummy lines DWL or buffer lines may be further between an uppermost word line WLn among the word lines WL0 to WLn and the string select lines SSL1 and SSL2. In some example embodiments, one or more dummy lines DWL may also be between a lowermost word line WL0 and the ground select line GSL.

For example, when a signal is applied to the string select transistors SST1 and SST2 through the string select lines SSL1 and SSL2, the signals applied through the bit lines BL0, BL1 and BL2 may be transmitted to the memory cells MC connected to each other in series, and thus, data reading and writing operations may be performed. In addition, by providing a specific (or, alternatively, predetermined) erase voltage through the substrate, an erasing operation of erasing the data written to the memory cells MC may also be performed. In some example embodiments, the memory cell array may also include at least one or more dummy memory cell strings electrically isolated from the bit lines BL0 to BL2.

Figure 3:
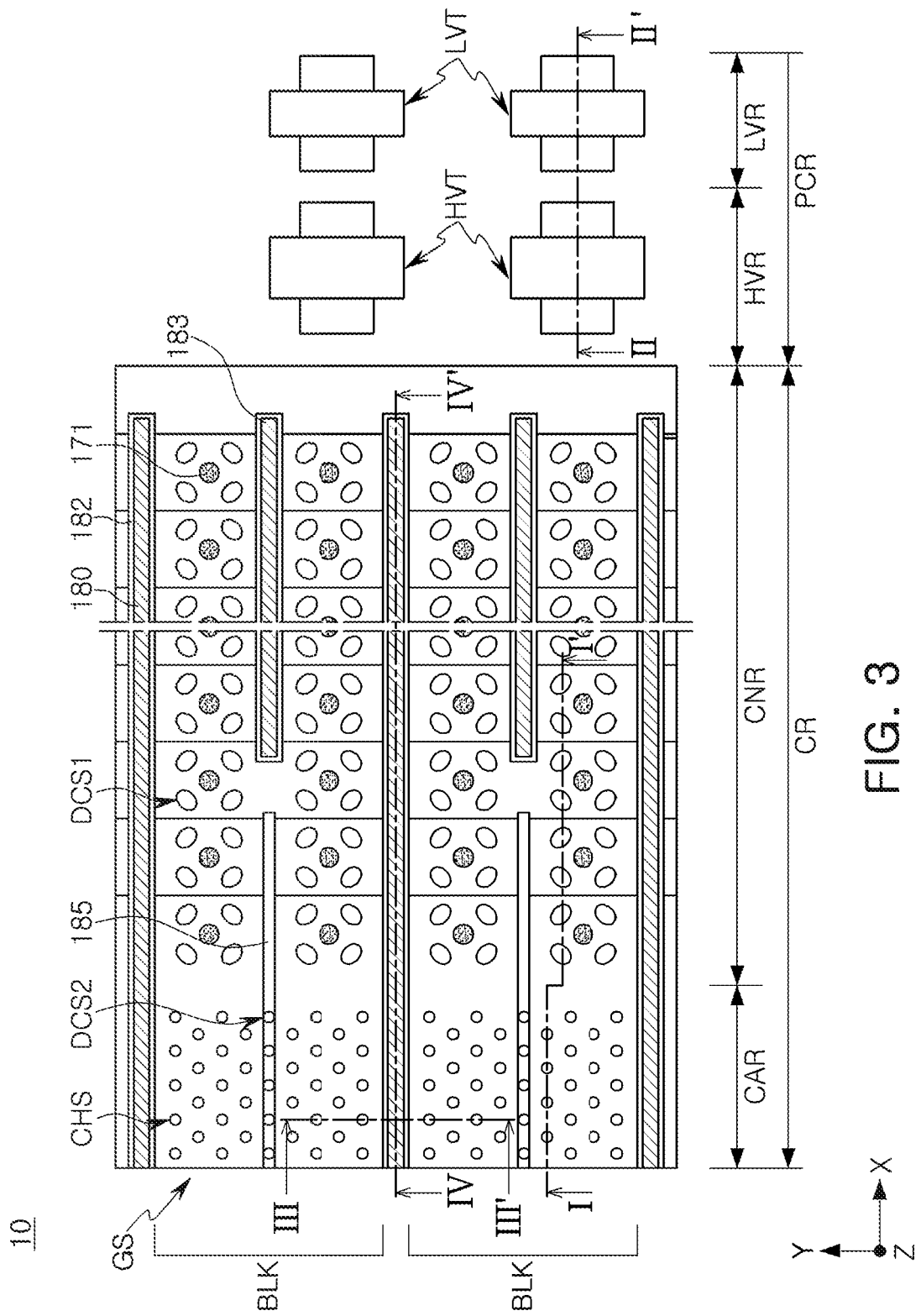
FIG. 3 is a schematic plan view of a vertical-type memory device according to some example embodiments of inventive concepts.
Figure 4:
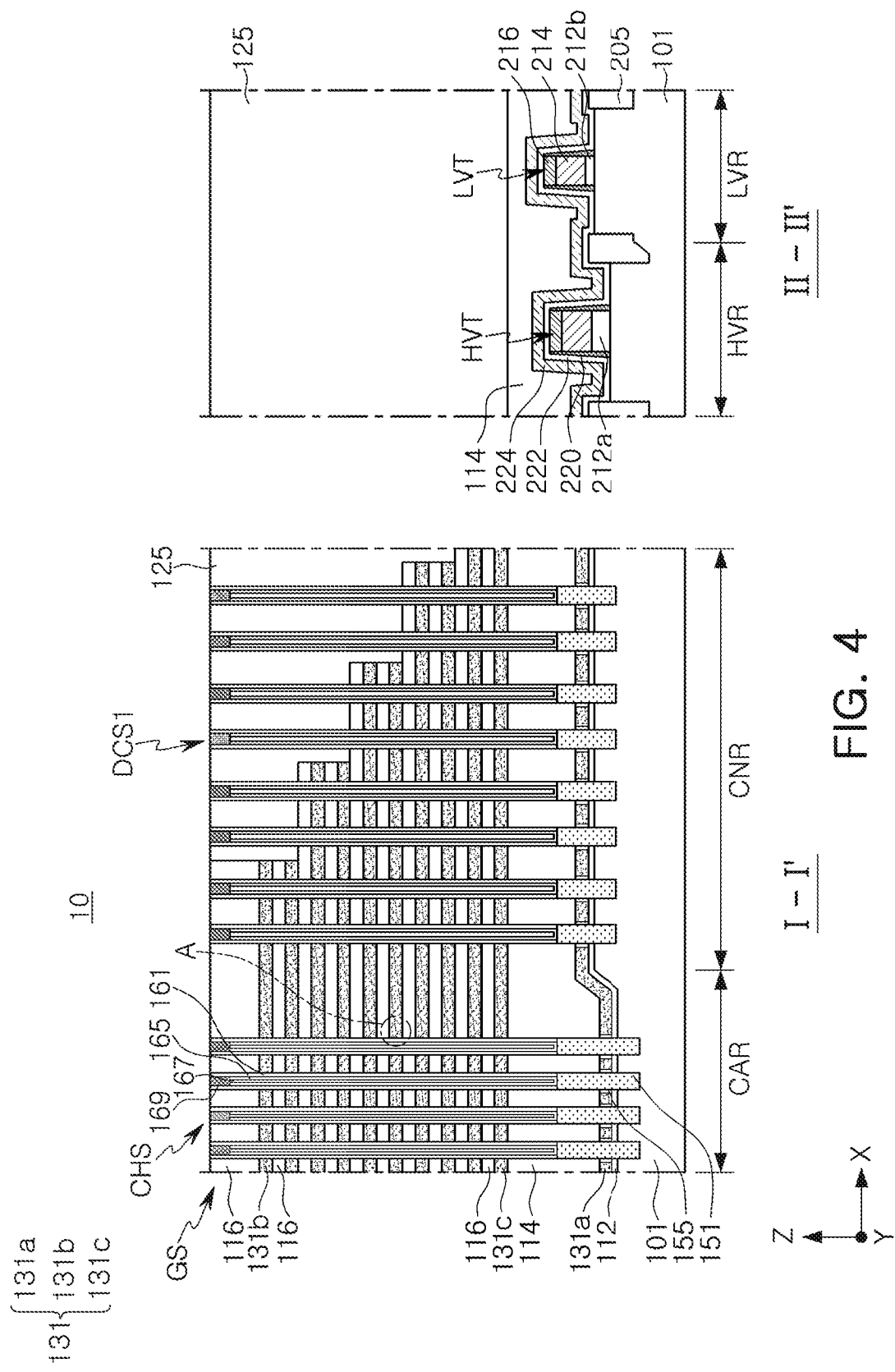
Figure 5:
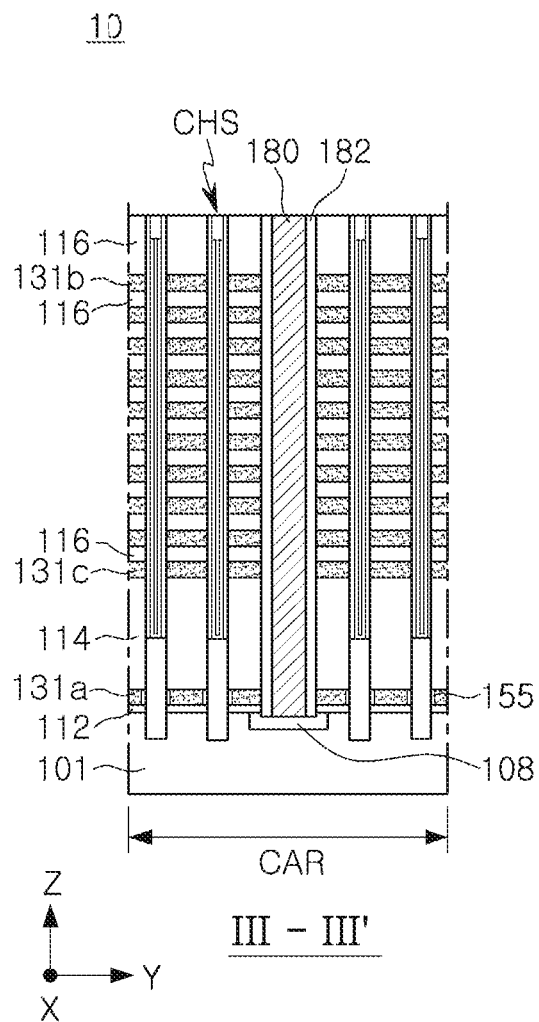

FIG. 3 is a schematic plan view of a vertical-type memory device 10 according to some example embodiments. FIG. 4 illustrates cross-sectional views taken along line I-I' and line II-II' of FIG. 3. FIG. 5 is a cross-sectional view taken along line III-III' of FIG. 3. FIG. 6 is a cross-sectional view taken along line IV-IV' of FIG. 3.

Referring to FIG. 3, the vertical-type memory device 10 according to some example embodiments may include a memory cell region CR and a peripheral circuit region PCR.

The memory cell region CR may include the cell array region CAR in which memory cells are formed, and the connection region CNR connecting wirings to gate electrodes of the memory cells. The peripheral circuit region PCR may include a high voltage region HVR and a low voltage region LVR.

A stacked structure GS may extend in a first direction D1, in the cell array region CAR and the connection region CNR. The stacked structure GS may include a plurality of gate electrode layers alternately stacked on the substrate. The stacked structure GS may be divided into a plurality of cell array blocks BLK by a plurality of separation patterns 180. The plurality of separation patterns 180 may continuously extend in the first direction D1 in the cell array region CAR and the connection region CNR. The plurality of separation patterns 180 may be electrically connected to the substrate. The plurality of separation patterns 180 may be formed of a conductive material. For example, the plurality of separation patterns 180 may include at least one of a metal such as tungsten, copper, titanium, aluminum or the like, a doped semiconductor material, and a conductive metal nitride film or the like. The plurality of separation patterns 180 may be common source lines. The plurality of separation patterns 180 may be electrically insulated from the plurality of gate electrode layers of the stacked structure GS.

An insulating layer 182 may be between the plurality of separation patterns 180 and the stacked structure GS. The insulating layer 182 may be formed of an insulating material. For example, the insulating layer 182 may include silicon oxide ($SiO_2$), silicon nitride ($Si_3N_4$), silicon oxynitride (SiON) or combinations thereof. Selectively, an auxiliary separation pattern 183 may be between the separation patterns 180 in the connection region CNR. The auxiliary separation pattern 183 may be formed of a conductive material and be electrically insulated from the plurality of gate electrode layers by the insulating layer 182.

In the cell array region CAR, a plurality of channel structures CHS may be connected to the substrate through the stacked structure GS, and a plurality of second dummy channel structures DCS2 may penetrate through a string insulating layer 185. In the connection region CNR, a plurality of first dummy channel structures DCS1 may be connected to the substrate through the stacked structure GS, and a plurality of contact plugs 171 may be connected to the plurality of gate electrode layers.

The plurality of channel structures CHS may be arranged in a plurality of rows and columns. The plurality of channel structures CHS may be arranged in a hexagonal close-packed lattice form or in a zigzag form; however, inventive concepts are not limited thereto. Three channel structures CHS, adjacent to each other, may be at vertices of an equilateral triangle. Line segments connecting the centers of the adjacent three channel structures CHS may form an equilateral triangle. For example, the channel structure CHS may have a circular cross-section. The arrangement of the plurality of channel structures CHS is not limited to that illustrated in FIG. 3, and may be variously modified.

The stacked structure GS may form a stepped structure including a plurality of stepped layers in the connection region CNR. The plurality of gate electrode layers of the stacked structure GS may extend to have different lengths, to form the stepped structure. The plurality of stepped layers may be provided as pad regions in which the plurality of contact plugs 171 are.

The plurality of first dummy channel structures DCS1 may penetrate through the plurality of stepped layers. Four adjacent first dummy channel structures DCS1 may be at corners of a quadrangular shape. The contact plug 171 may be between the four adjacent first dummy channel structures DCS1. For example, the first dummy channel structure DCS1 may have an elliptical cross-section. A cross-sectional area of the first dummy channel structure DCS1 may be greater than a cross-sectional area of the channel structure CHS. For example, the first dummy channel structure DCS1 may have a circular cross section, and a diameter of the channel structure CHS may be smaller than a diameter of the first dummy channel structure DCS1. However, the layout of the plurality of dummy channel structures DCS is not limited to that illustrated in the drawing.

The plurality of channel structures CHS are connected to bit lines, to perform reading/writing operations, while the plurality of first and second dummy channel structures DCS1 and DCS2 may not be connected to the bit lines. For example, the plurality of first and second dummy channel structures may be floating during operation of the memory device 10. The plurality of first dummy channel structures DCS1 may serve to support the stacked structure GS in the connection region CNR.

A high voltage transistor HVT may be in a high voltage region HVR, and a low voltage transistor LVT may be in a low voltage region LVR.

Referring to FIGS. 4, 5 and 6, the vertical-type memory device 10 may include a substrate 101, the stacked structure GS, the channel structures CHS, the first dummy channel structures DCS1, the high voltage transistor HVT, the low voltage transistor LVT, and the like.

The substrate 101 may include a semiconductor material, such as a Group IV semiconductor material, a Group III-V compound semiconductor material, or a Group II-VI compound semiconductor material. The stacked structure GS may include a plurality of gate electrode layers 131 alternately stacked, e.g. alternatively stacked between a plurality of mold insulating layers 116, on the substrate 101. The plurality of gate electrode layers 131 may be stacked on the substrate 101, to be spaced apart from each other, in a third direction, for example, a Z direction, perpendicular to an upper surface of the substrate 101. The plurality of gate electrode layers 131 may extend in a first direction, for example, an X direction, intersecting the third direction, the Z direction, and may be in the cell array region CAR and the connection region CNR. The plurality of gate electrode layers 131 may extend in a second direction, for example, a Y direction, intersecting the first direction, the X direction and the third direction, the Z direction. The stacked structure GS may have a stepped structure including a plurality of stepped layers in the connection region CNR. The plurality of gate electrode layers 131 may extend to have different lengths in the first direction, the X direction, to form the stepped structure in the connection region CNR. A plurality of mold insulating layers 116 may be between the plurality of gate electrode layers 131 or on the plurality of gate electrode layers 131. The plurality of mold insulating layers 116 may extend to have different lengths in the first direction to form a stepped structure together with the gate electrode layers 131. Portions of the plurality of gate electrode layers 131 may extend to have the same length. Portions of the plurality of mold insulating layers 116 may extend to have the same length. The number of the plurality of gate electrode layers 131 is not limited to that illustrated in FIGS. 4 and 5. The number of the gate electrode layers 131 constituting the memory cells may be increased to increase a storage capacity of the vertical-type memory device 10. For example, several tens to several hundreds of the gate electrode layers 131 may be stacked on the substrate 101.

The gate electrode layer 131 closest to the substrate 101, for example, a lowermost gate electrode layer 131*a*, may be provided as a ground select line or a lower select line, and one or two uppermost gate electrode layers 131*b* in the stacked structure GS may be provided as a string select line or an upper select line. The remaining intermediate gate electrode layers 131*c* of the stacked structure GS may be provided as word lines. A buffer insulating layer 112 may be between the lowermost gate electrode layer 131*a* and the substrate 101. A first interlayer insulating layer 114 may be between the lowermost gate electrode layer 131*a* and the intermediate gate electrode layer 131*c* adjacent thereto. The first interlayer insulating layer 114 may be between the ground select line and the word line. The first interlayer insulating layer 114 may cover the high voltage transistor HVT and the low voltage transistor LUT. A second interlayer insulating layer 125 may be on the stacked structure GS of the connection region CNR, and may be on the first interlayer insulating layer 114 of the high voltage region HVR and the low voltage region LVR.

An upper surface of the substrate 101 may have a step portion at a boundary between the cell array region CAR and the connection region CNR.

The buffer insulating layer 112 may have a uniform thickness on the upper surface of the substrate 101, in the cell array region CAR and the connection region CNR. The buffer insulating layer 112 may have a bent portion bent along the upper surface of the substrate 101 at the boundary between the cell array region CAR and the connection region CNR.

The lowermost gate electrode layer 131a may be formed to have a uniform thickness on the buffer insulating layer 112 between the cell array region CAR and the connection region CNR. The lowermost gate electrode layer 131a may have a bent portion bent along the upper surface of the substrate 101 at the boundary between the cell array region CAR and the connection region CNR.

A thickness of the first interlayer insulating layer 114 formed on the lowermost gate electrode layer 131a may not have a uniform thickness in the cell array region CAR and the connection region CNR. A thickness of the first interlayer insulating layer 114 in the cell array region CAR may be greater than a thickness of the first interlayer insulating layer 114 in the connection region CNR.

The upper surface of the substrate 101 may have different levels in the high voltage region HVR and the low voltage region LVR. An upper surface of the substrate 101 in the high voltage region HVR may be on a lower level than an upper surface of the substrate 101 in the low voltage region LVR. In some example embodiments, the upper surface of the substrate 101 in the high voltage region HVR and the low voltage region LVR may be located on the same level.

Figure 11A:
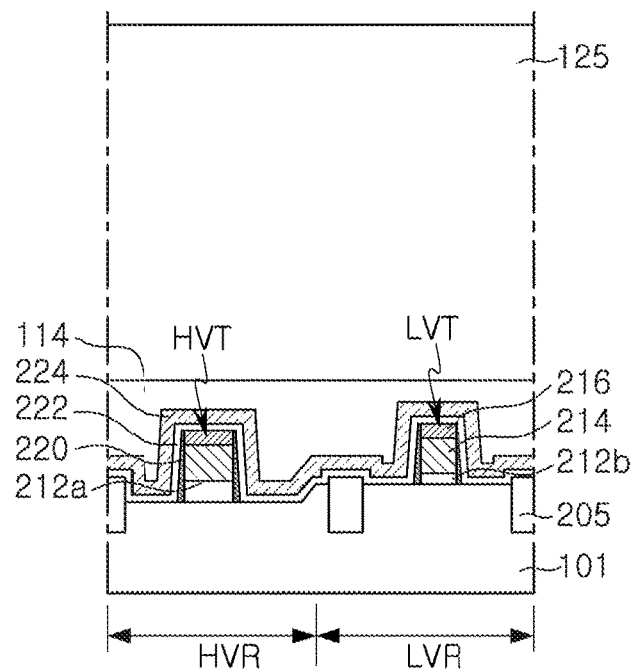
FIGS. 11A and 11B are drawings illustrating a peripheral circuit region of a vertical-type memory device according to some example embodiments of inventive concepts.
Figure 11B:
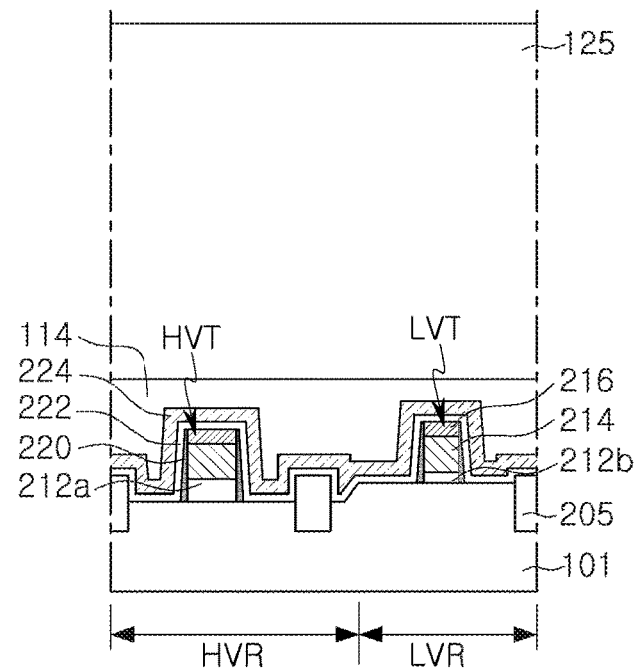

The high voltage transistor HVT may include a high voltage gate insulating layer 212a and a gate electrode 214, and the low voltage transistor LVT may include a low voltage gate insulating layer 212b and the gate electrode 214. The low voltage gate insulating layer 212b may be thinner than the high voltage gate insulating layer 212a. A capping layer 216 may be on the gate electrode 214, and a spacer 220 may be on a side wall of the gate electrode 214. A device isolation layer 205 may be between the high voltage transistor HVT and the low voltage transistor LVT. The device isolation layer 205 may be formed at a boundary between the high voltage region HVR and the low voltage region LVR, and a lower portion of the device isolation layer 205 between the high voltage transistor HVT and the low voltage transistor LVT may have a step portion. In a case in which the device isolation layer 205 is formed in the low voltage region LVR to be adjacent to a boundary between the high voltage region HVR and the low voltage region LVR as illustrated in FIG. 11A, or in a case in which the device isolation layer 205 is formed in the high voltage region HVR to be adjacent to the boundary between the high voltage region HVR and the low voltage region LVR as illustrated in FIG. 11B, a lower portion of the device isolation layer 205 between the high voltage transistor HVT and the low voltage transistor LVT may not have a step portion. In some example embodiments, the device isolation layer 205 may be formed in both of the low voltage region LVR and the high voltage region HVR, to be adjacent to the boundary between the high voltage region HVR and the low voltage region LVR.

A first insulating layer 222 and a second insulating layer 224 may cover the high voltage transistor HVT and the low voltage transistor LVT.

A height of the step portion formed on the upper surface of the substrate 101 at the boundary between the cell array region CAR and the connection region CNR may be greater than a difference in levels between an upper surface of the substrate 101 in the high voltage region HVR and an upper surface of the substrate 101 in the low voltage region LVR.

The height of the step portion formed on the upper surface of the substrate 101 at the boundary between the cell array region CAR and the connection region CNR may be greater than a thickness of the high voltage gate insulating layer 212a of the high voltage transistor HVT.

The gate electrode layers 131 may include a metallic material, a metal nitride, a metal silicide material, polycrystalline silicon, or combinations thereof; however, inventive concepts are not limited thereto. The metallic material may include, for example, tungsten (W), copper (Cu), aluminum (Al), or combinations thereof; however, inventive concepts are not limited thereto. The metal silicide material may be a silicide material including a metal selected from, for example, cobalt (Co), nickel (Ni), hafnium (Hf), platinum (Pt), tungsten (W), titanium (Ti), or combinations thereof; however, inventive concepts are not limited thereto. The metal nitride may include, for example, tungsten nitride (WN), tantalum nitride (TaN), titanium nitride (TiN), or combinations thereof; however, inventive concepts are not limited thereto. The buffer insulating layer 112, the first interlayer insulating layer 114, and the mold insulating layers 116 may include a silicon oxide; however, inventive concepts are not limited thereto. The second interlayer insulating layer 125 may include a silicon oxide or a low dielectric material; however, inventive concepts are not limited thereto. The low dielectric material may be an insulating material having a lower dielectric constant than silicon oxide; however, inventive concepts are not limited thereto.

The plurality of channel structures CHS may be in the cell array region CAR, to pass through the plurality of gate electrode layers 131. The diameters of the plurality of channel structures CHS may be gradually reduced toward the substrate 101. The plurality of first dummy channel structures DCS1 may pass through at least a portion of the plurality of gate electrode layers 131, in the connection region CNR. Vertical lengths of the plurality of channel structures CHS may be greater than vertical lengths of the plurality of first dummy channel structures DCS1. The vertical length refers to a length in the Z direction.

Each of the plurality of channel structures CHS in the cell array region CAR may include an epitaxial layer 151, a gate dielectric layer 161, a channel layer 165, an insulating layer 167, and a contact pad 169. The plurality of first dummy channel structures DCS1 may have the same structure as that of the plurality of channel structures CHS. A horizontal cross section of the plurality of first dummy channel structures DCS1 may have a shape different from that of the plurality of channel structures CHS. The horizontal cross section refers to a section cut in a direction parallel to the upper surface of the substrate 101. The horizontal cross section of the plurality of first dummy channel structures DCS1 may be elliptical, and the horizontal cross section of the plurality of channel structures CHS may be circular. In some example embodiments, the horizontal cross section of the plurality of first dummy channel structures DCS1 and the horizontal cross section of the plurality of channel structures CHS may be circular. The first dummy channel structures DCS1 may respectively have a greater diameter or a greater cross-sectional area than that of the channel structures CHS.

Figure 8:
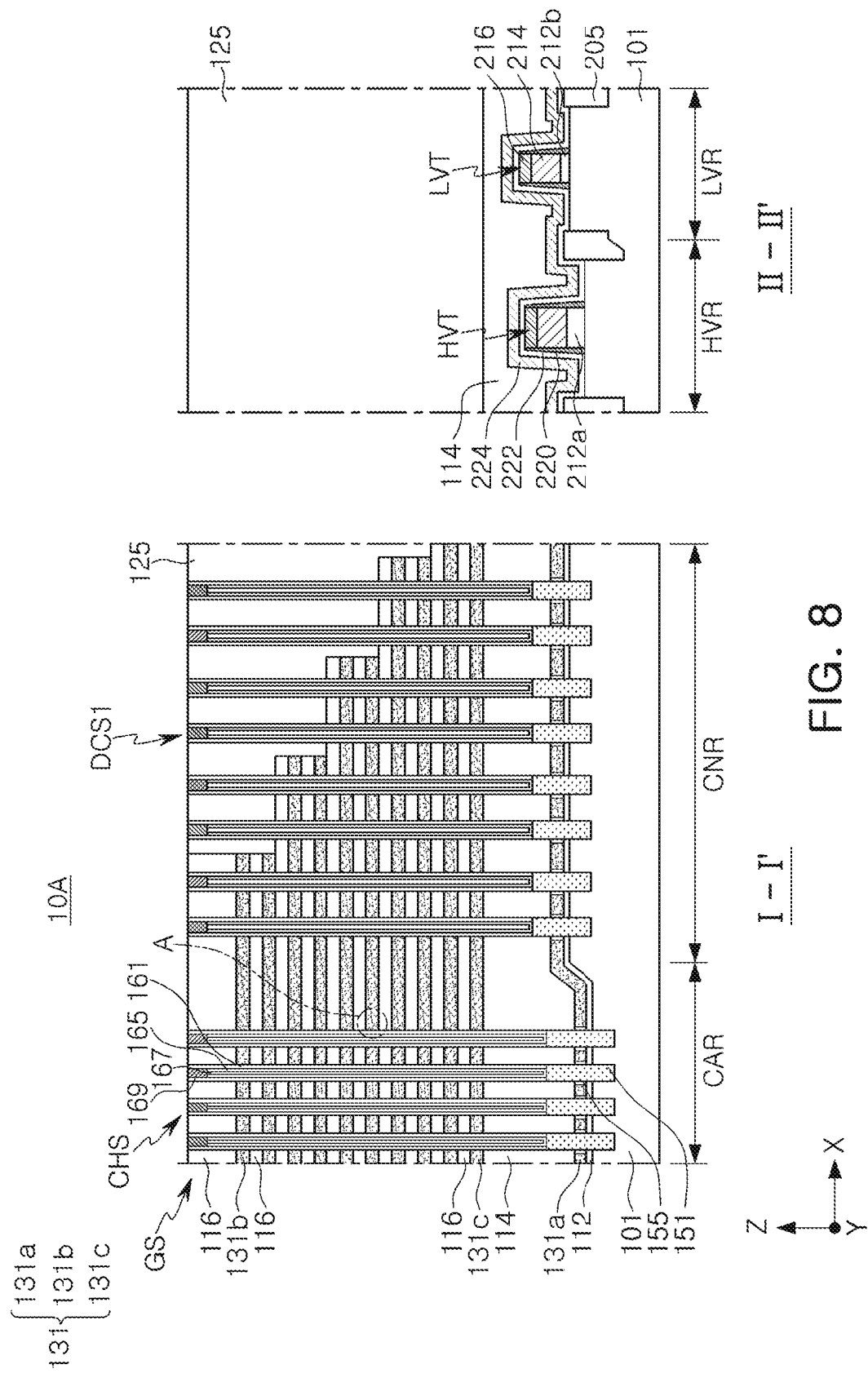
FIG. 8 is a schematic cross-sectional view of a vertical-type memory device according to some example embodiments of inventive concepts.

The epitaxial layer 151 may be between the channel layer 165 and the substrate 101, and may electrically connect the channel layer 165 and the substrate 101 to each other. A height of an upper surface of the epitaxial layer 151 may be higher than that of an upper surface of the lowermost gate electrode layer 131a. The height of the upper surface of the epitaxial layer 151 formed in the cell array region CAR is illustrated as being the same as the height of the upper surface of the epitaxial layer 151 formed in the connection region CNR in FIG. 4, but some example embodiments thereof is not limited thereto. In some example embodiments, a height of an upper surface of the epitaxial layer 151 formed in the cell array region CAR may be different from a height of an upper surface of the epitaxial layer 151 formed in the connection region CNR. In some example embodiments, a height of the upper surface of the epitaxial layer 151 formed in the cell array region CAR may be higher than the height of the upper surface of the epitaxial layer 151 formed in the connection region CNR. In some example embodiments, a height of an upper surface of the epitaxial layer 151 formed in the cell array region CAR may be lower than a height of an upper surface of the epitaxial layer 151 formed in the connection region CNR (see FIG. 8). The epitaxial layer 151 may be formed by a selective epitaxial growth process. The epitaxial layers 151 may include a semiconductor material such as monocrystalline silicon or the like. The epitaxial layers 151 may be doped with n-type and/or p-type impurities. However, inventive concepts are not limited thereto. The epitaxial layer 151 may include germanium and/or carbon. The epitaxial layer 151 may be a heteroepitaxial layer.

Insulating layers 155 may be locally between the epitaxial layers 151 and the lowermost gate electrode layer 131a.

The channel layer 165 may extend perpendicularly to the upper surface of the substrate 101, and may have an internal space. The internal space of the channel layer 165 may be filled with an insulating layer 167. The channel layer 165 may include a semiconductor material such as polycrystalline silicon, monocrystalline silicon, and/or the like. The insulating layer 167 may include an insulating material such as silicon oxide or the like. The contact pad 169 may include a semiconductor material, such as polycrystalline silicon or the like.

The gate dielectric layer 161 may be at least between the gate electrode layer 131 and the channel layer 165. The gate dielectric layer 161 may be formed to surround an outer surface of the channel layer 165.

Figure 7A:
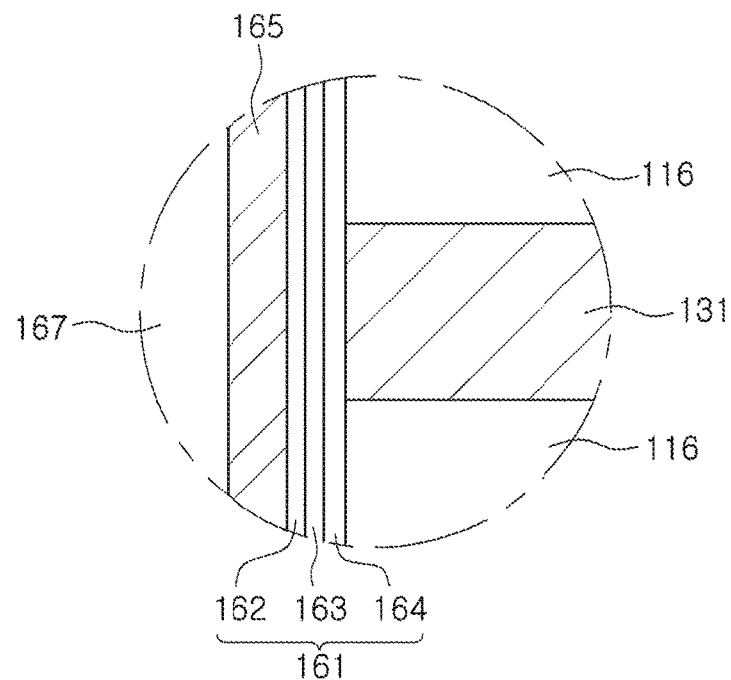
FIGS. 7A and 7B are drawings illustrating a gate dielectric layer of a semiconductor device according to some example embodiments of inventive concepts.

Referring to FIG. 7A, the gate dielectric layer 161 may include a tunneling layer 162, a charge trapping layer 163, and a blocking layer 164, sequentially from the outer surface of the channel layer 165. The tunneling layer 162, the charge trapping layer 163, and the blocking layer 164 may all extend vertically along the channel layer 165. The tunneling layer 162 may include, for example, silicon oxide. The charge trapping layer 163 may include, for example, silicon nitride. The blocking layer 164 may include silicon oxide ($SiO_2$), silicon nitride ($Si_3N_4$), silicon oxynitride (SiON), and/or a high-k dielectric material. The high-k dielectric material may be or include any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

Figure 7B:
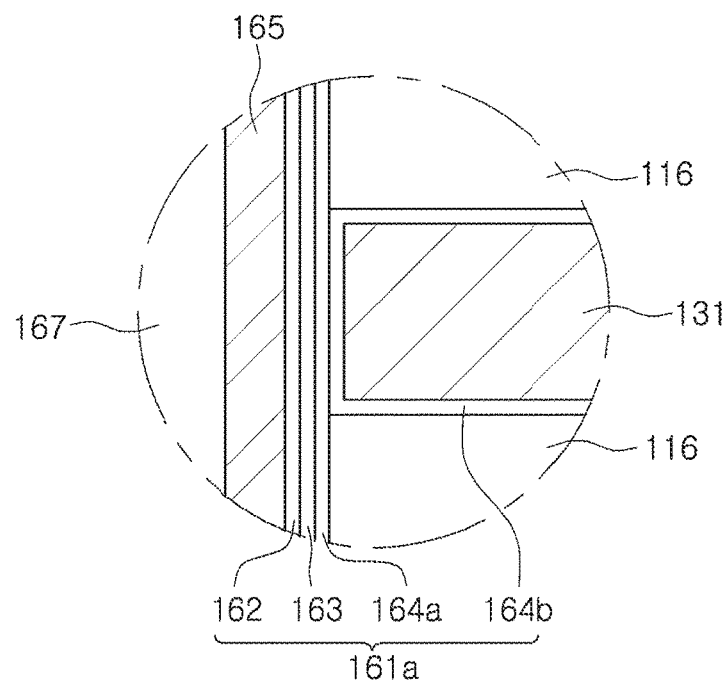

With reference to FIG. 7B, the gate dielectric layer 161 may include a tunneling layer 162, a charge trapping layer 163, a first blocking layer 164a, and a second blocking layer 164b, sequentially from an outer surface of the channel layer 165.

The tunneling layer 162, the charge trapping layer 163 and the first blocking layer 164a may extend vertically along the channel layer 165. The second blocking layer 164b may surround the gate electrode layer 131. The second blocking layer 164b may be formed of a high-k dielectric material. The first blocking layer 164a may be formed of a relatively low dielectric constant material, as compared with that of the second blocking layer 164b.

Referring to FIGS. 5 and 6, the separation pattern 180 may continuously extend in a first direction, for example, the X direction, in the cell array region CAR and the connection region CNR. The plurality of separation patterns 180 may divide the plurality of gate electrode layers 131 into a plurality of regions. The plurality of separation patterns 180 may be insulated from the plurality of gate electrode layers 131 by the insulating layer 182. The plurality of separation patterns 180 may be electrically connected to the substrate 101 by the plurality of gate electrode layers 131. The plurality of separation patterns 180 may be connected to an impurity region 108 formed in an upper portion of the substrate 101. A lower surface of the separation pattern 180 may have a step portion at a boundary between the cell array region CAR and the connection region CNR, to correspond to a shape of the substrate 101. The separation pattern 180 may be formed of a conductive material. For example, the separation pattern 180 may include at least one of a metal such as tungsten, copper, titanium, aluminum and the like, a doped semiconductor material, and a conductive material such as a conductive metal nitride film. The separation pattern 180 may be a common source line.

Figure 9:
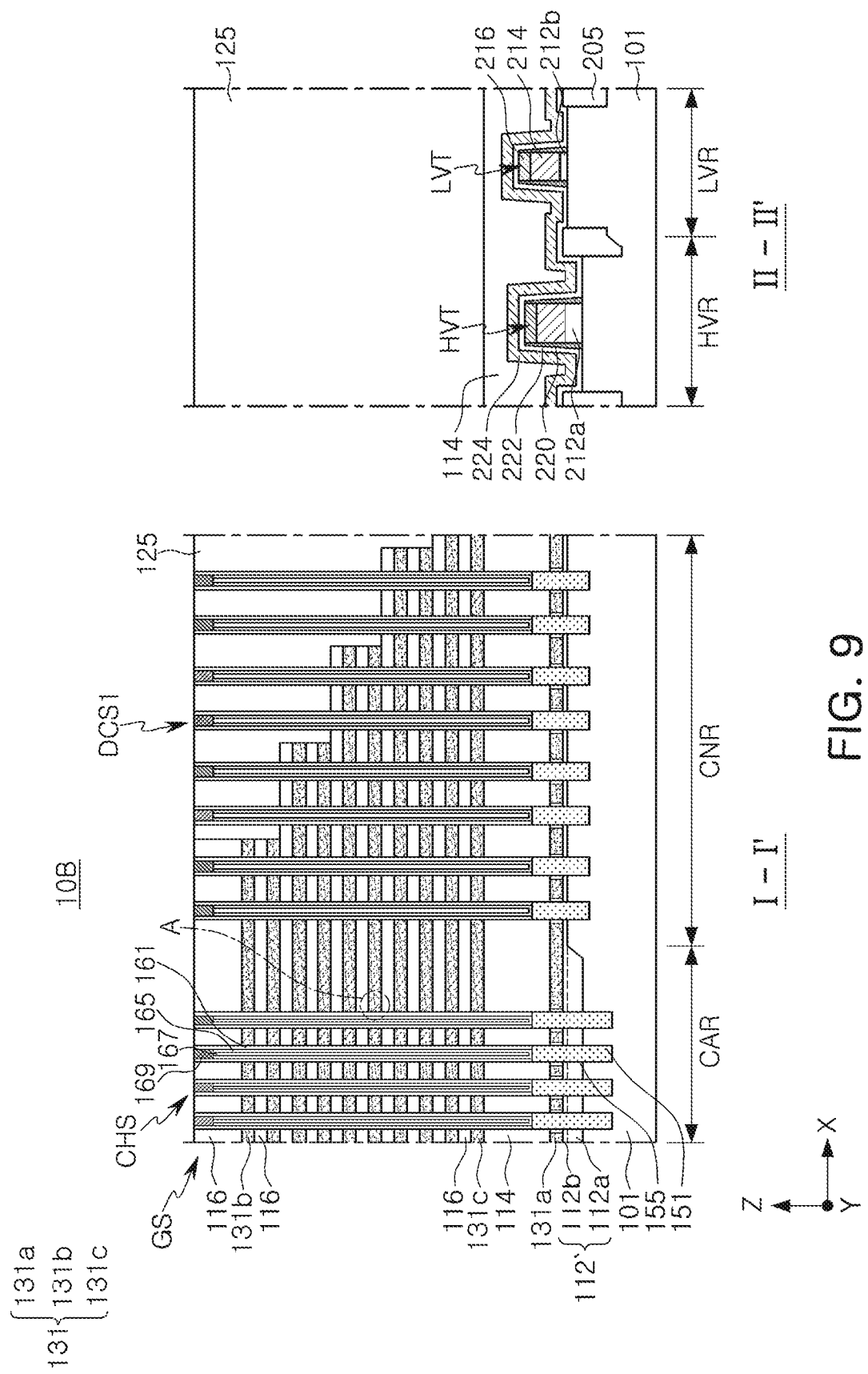
FIG. 9 is a schematic cross-sectional view of a vertical-type memory device according to some example embodiments of inventive concepts.

FIG. 9 is a schematic cross-sectional view of a vertical-type memory device 10B according to some example embodiments. FIG. 9 is a cross-sectional view corresponding to FIG. 4, and a description of the same parts as those in FIG. 4 will be omitted, and descriptions of parts different therefrom will be provided below.

Referring to FIG. 9, an upper surface of a substrate 101 may have a step portion at a boundary between a cell array region CAR and a connection region CNR.

A buffer insulating layer 112' on an upper surface of the substrate 101 may have different thicknesses in the cell array region CAR and the connection region CNR. The buffer insulating layer 112' may have a greater thickness in the cell array region CAR than in the connection region CNR. The buffer insulating layer 112' may include a first buffer insulating layer 112a and a second buffer insulating layer 112b. The first buffer insulating layer 112a and the second buffer insulating layer 112b may be in the cell array region CAR, and only the second buffer insulating layer 112b may be in the connection region CNR. The first buffer insulating layer 112a may have a portion in which a thickness thereof is gradually decreased at a boundary between the cell array region CAR and the connection region CNR. The thickness of the first buffer insulating layer 112a may be the same as a thickness of a high voltage gate insulating layer 212a. An upper surface of the buffer insulating layer 112' may be flat, and a lower surface of the buffer insulating layer 112' may have a step portion in the cell array region CAR and the connection region CNR.

A lowermost gate electrode layer 131a may be formed to have a uniform thickness on the buffer insulating layer 112', in the cell array region CAR and the connection region CNR. Alternatively, the lowermost gate electrode layer 131 may not have a bent portion at the boundary between the cell array region CAR and the connection region CNR.

Alternatively, a thickness of a first interlayer insulating layer 114 formed on the lowermost gate electrode layer 131a may be the same in the cell array region CAR and the connection region CNR.

A height of the step portion formed on the upper surface of the substrate 101 at the boundary between the cell array region CAR and the connection region CNR may be the same as a difference in levels between an upper surface of the substrate 101 in a high voltage region HVR and an upper surface of the substrate 101 in the low voltage region LVR.

Figure 10:
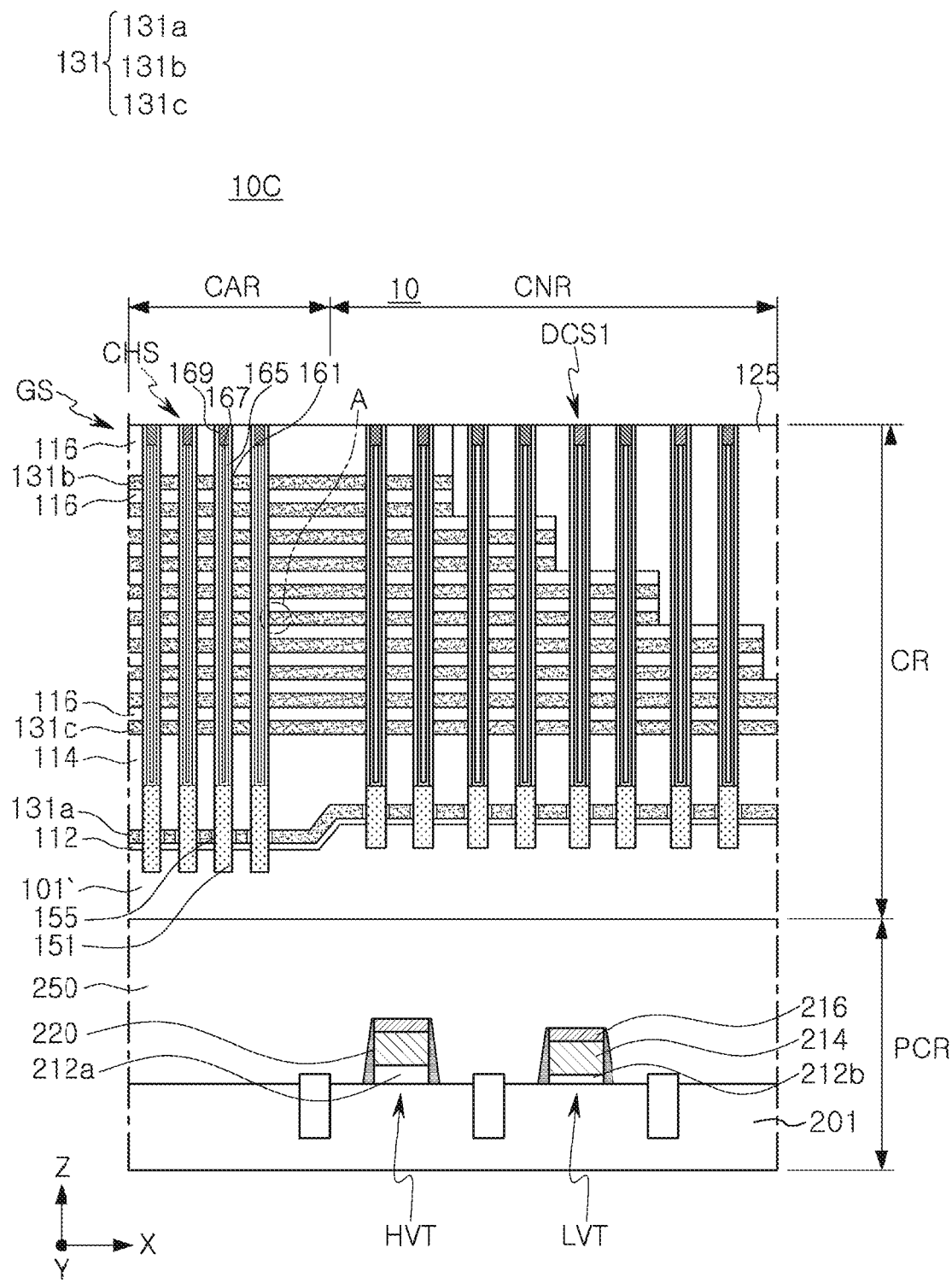
FIG. 10 is a schematic cross-sectional view of a vertical-type memory device according to some example embodiments of inventive concepts.

FIG. 10 is a schematic cross-sectional view of a vertical-type memory device 10C according to some example embodiments. Hereinafter, descriptions of the same parts as those in FIG. 4 will be omitted, and descriptions of parts different therefrom will be provided.

Referring to FIG. 10, the vertical-type memory device 10C may include a memory cell region CR and a peripheral circuit region PCR, in a vertical direction. The memory cell region CR may be on the peripheral circuit region PCR. Alternatively, in some example embodiments, the memory cell region CR may also be below the peripheral circuit region PCR.

The memory cell region CR may include a substrate 101', gate electrode layers 131 stacked on the substrate 101', channel structures CHS, first dummy channel structures DCS1, and the like, in a manner similar to the description with reference to FIG. 4. The substrate 101' may include polycrystalline silicon. The substrate 101' may have a step portion at a boundary between a cell array region CAR and a connection region CNR.

The peripheral circuit region PCR may include a base substrate 201, a high voltage transistor HVT and a low voltage transistor LVT on the base substrate 201. The peripheral circuit region PCR may include contact plugs and wirings connected to the high voltage transistor HVT and the low voltage transistor LVT.

Device isolation layers 205 defining active regions of the high voltage transistor HVT and the low voltage transistor LVT may be formed in the base substrate 201. The base substrate 301 may include a semiconductor material, for example, a Group IV semiconductor material, a Group III-V compound semiconductor material, or a Group II-VI compound semiconductor material; however, inventive concepts are not limited thereto. A base interlayer insulating layer 250 may cover the high voltage transistor HVT and the low voltage transistor LVT. A substrate 101' may be on the base interlayer insulating layer 250.

The substrate 101' may have the same size as the base substrate 201, or may be formed to be smaller than the base substrate 201. The memory cell region CR and the peripheral circuit region PCR may be electrically connected to each other in an unillustrated region.

FIGS. 12 to 17 are schematic views illustrating a method of manufacturing a vertical-type memory device 10 according to some example embodiments.

Figure 12:
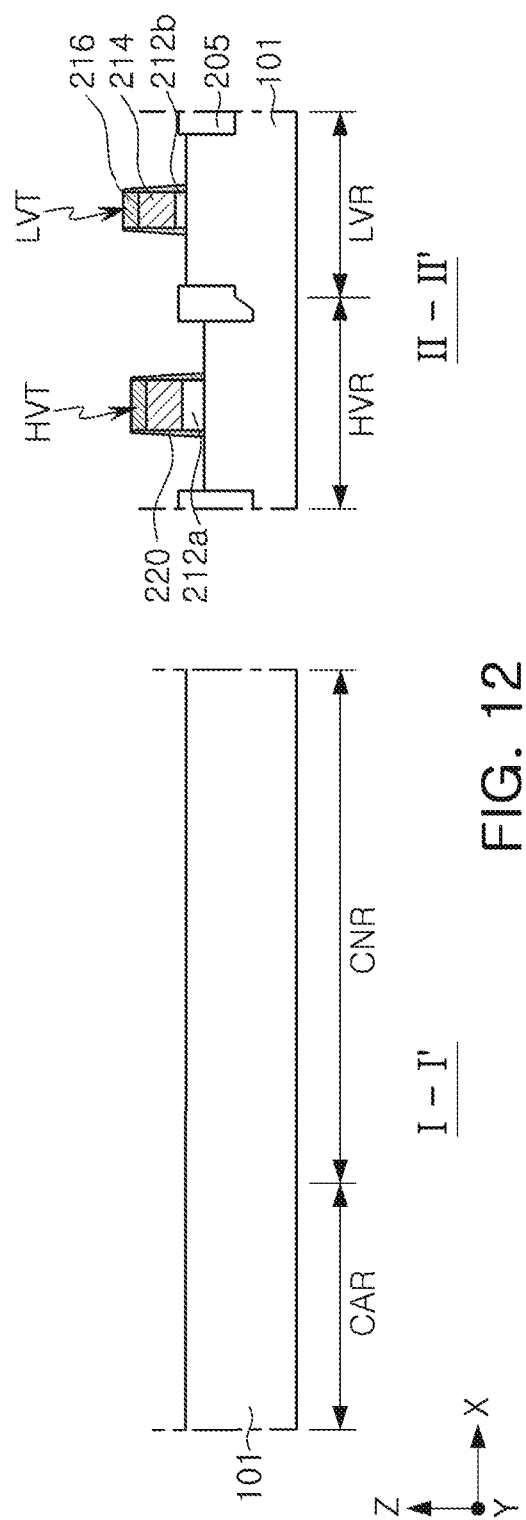
FIGS. 12 to 16 are schematic views illustrating a method of manufacturing a vertical-type memory device according to some example embodiments of inventive concepts.

Referring to FIG. 12, a high voltage transistor HVT and a low voltage transistor LVT may be formed in a high voltage region HVR and a low voltage region LVR of a substrate 101, respectively.

An upper surface of the substrate 101 in the high voltage region HVR may be located on a lower level than that of an upper surface of the substrate 101 in the low voltage region LVR. Alternatively, in some example embodiments, the upper surfaces of the substrate 101 in the high voltage region HVR and the low voltage region LVR may be located on the same level.

The high voltage transistor HVT may include a high voltage gate insulating layer 212a and a gate electrode 214, and the low voltage transistor LVT may include a low voltage gate insulating layer 212b and a gate electrode 214. A capping layer 216 may be on the gate electrode 214, and a spacer 220 may be on a side wall of the gate electrode 214. A device isolation layer 205 may be between the high voltage transistor HVT and the low voltage transistor LVT. The device isolation layer 205 may be formed by, for example, a shallow trench isolation (STI) process and/or a deep trench isolation (DTI) process.

Figure 13:
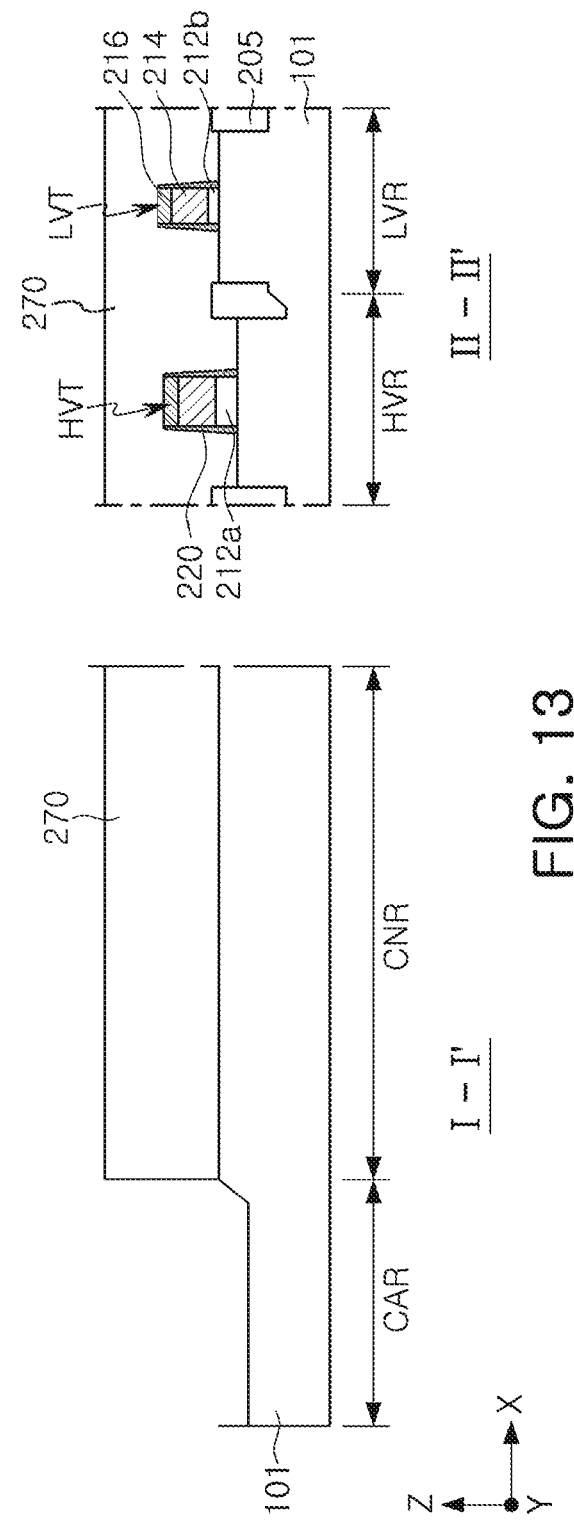

Referring to FIG. 13, a cell array region CAR of the substrate 101 may be partially removed. After forming a mask pattern 270 only exposing the cell array region CAR, an etching process may be performed. The mask pattern 270 may be or include a photoresist pattern, and may be removed after the etching process is completed, thereby forming a step portion on the upper surface of the substrate 101 at a boundary between the cell array region CAR and a connection region CNR.

Figure 14:
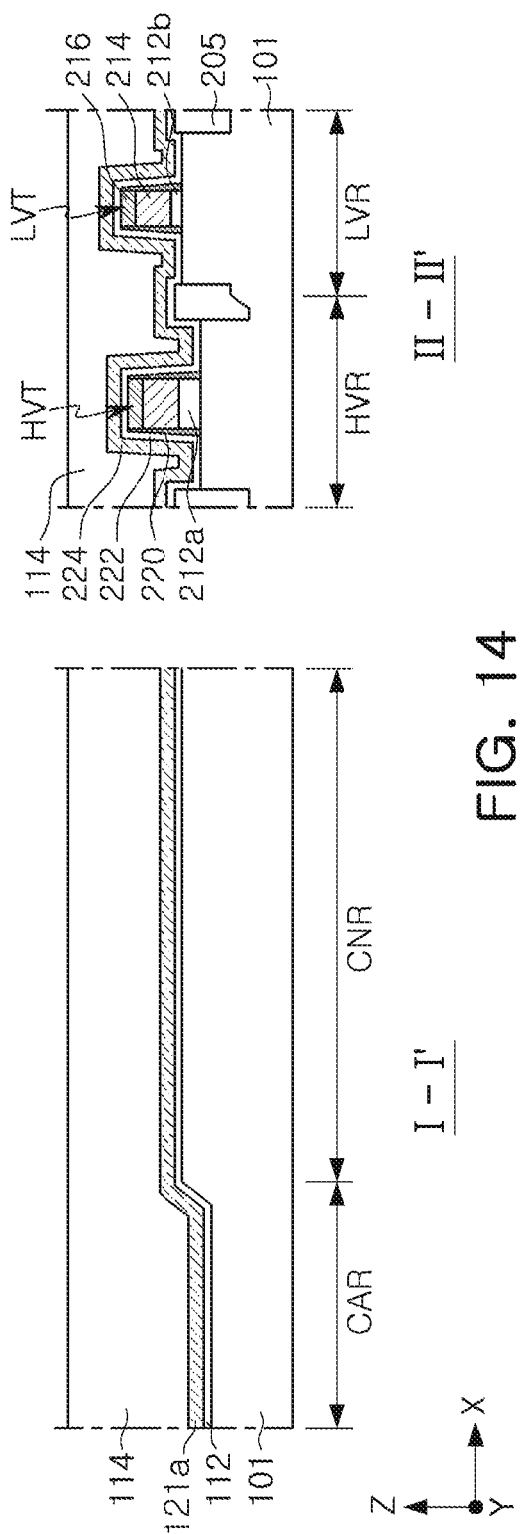

Referring to FIG. 14, a buffer insulating layer 112 and a lowermost sacrificial layer 121a may be formed on the cell array region CAR and the connection region CNR of the substrate 101. A first insulating layer 222 and a second insulating layer 224 may be formed on the high voltage region HVR and the low voltage region LVR of the substrate 101. The buffer insulating layer 112 and the first insulating layer 222 may be simultaneously formed by a single deposition process. Further, the lowermost sacrificial layer 121a and the second insulating layer 224 may be simultaneously formed by a single deposition process. The lowermost sacrificial layer 121a may be formed of a material having etch selectivity with respect to the buffer insulating layer 112. For example, the buffer insulating layer 112 and the first insulating layer 222 may be formed of silicon oxide, and the lowermost sacrificial layer 121a and the second insulating layer 224 may be formed of silicon nitride; however, inventive concepts are not limited thereto.

The first interlayer insulating layer 114 may be formed to cover the lowermost sacrificial layer 121a and the second insulating layer 224. The first interlayer insulating layer 114 may be formed of a material having etch selectivity with respect to the lowermost sacrificial layer 121a. Forming the first interlayer insulating layer 114 may include a deposition process in which a silicon oxide film is formed on the substrate 101, and a planarization process, for example, a chemical mechanical polishing (CMP) process. A height of the first interlayer insulating layer 114 may be adjusted to prevent or reduce the likelihood of the second insulating layer 224 from being exposed.

Figure 15:
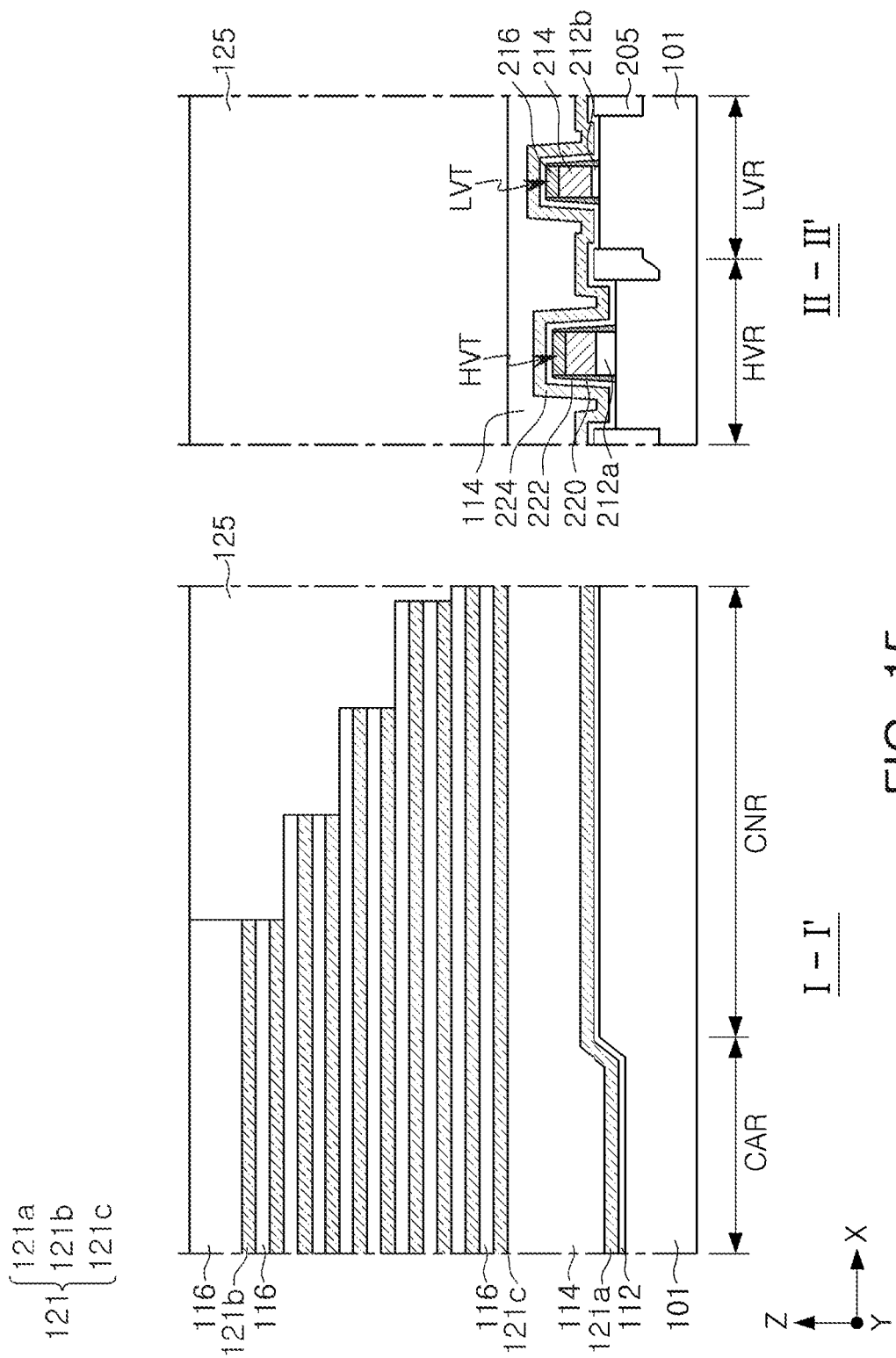

Referring to FIG. 15, the sacrificial layers 121 and mold insulating layers 116 may be alternately stacked on the first interlayer insulating layer 114. The sacrificial layers 121 may include the lowermost sacrificial layer 121a, an uppermost sacrificial layer 121b, and intermediate sacrificial layer 121c between the lowermost sacrificial layer 121a and the uppermost sacrificial layer 121b. The sacrificial layers 121 may be formed of a material having etch selectivity with respect to the mold insulating layers 116. For example, the mold insulating layers 116 may be formed of silicon oxide, and the sacrificial layers 121 may be formed of silicon nitride.

Next, a stepped structure may be formed by patterning the mold insulating layers 116 and the sacrificial layers 121 of the connection region CNR. The stepped structure may be formed by patterning the mold insulating layers 116 and the sacrificial layers 121 a plurality of times. Each of stepped layers constituting the stepped structure may include two mold insulating layers 116 and two sacrificial layers 121. In some example embodiments, each of the stepped layers may include three or more mold insulating layers 116 and three or more sacrificial layers 121. Lengths of the mold insulating layers 116 and the sacrificial layers 121 in the first direction, for example, the X direction, may be reduced as distances thereof from the substrate 101 increases.

Subsequently, a second interlayer insulating layer 125 may be formed on the substrate 101. The second interlayer insulating layer 125 may be formed to have a sufficient thickness, to cover the sacrificial layers 121 and mold insulating layers 116 of the connection region CNR. Forming the second interlayer insulating layer 125 may include a process of depositing a silicon oxide or a low dielectric material, and a planarization process, for example, a CMP process.

Figure 16:
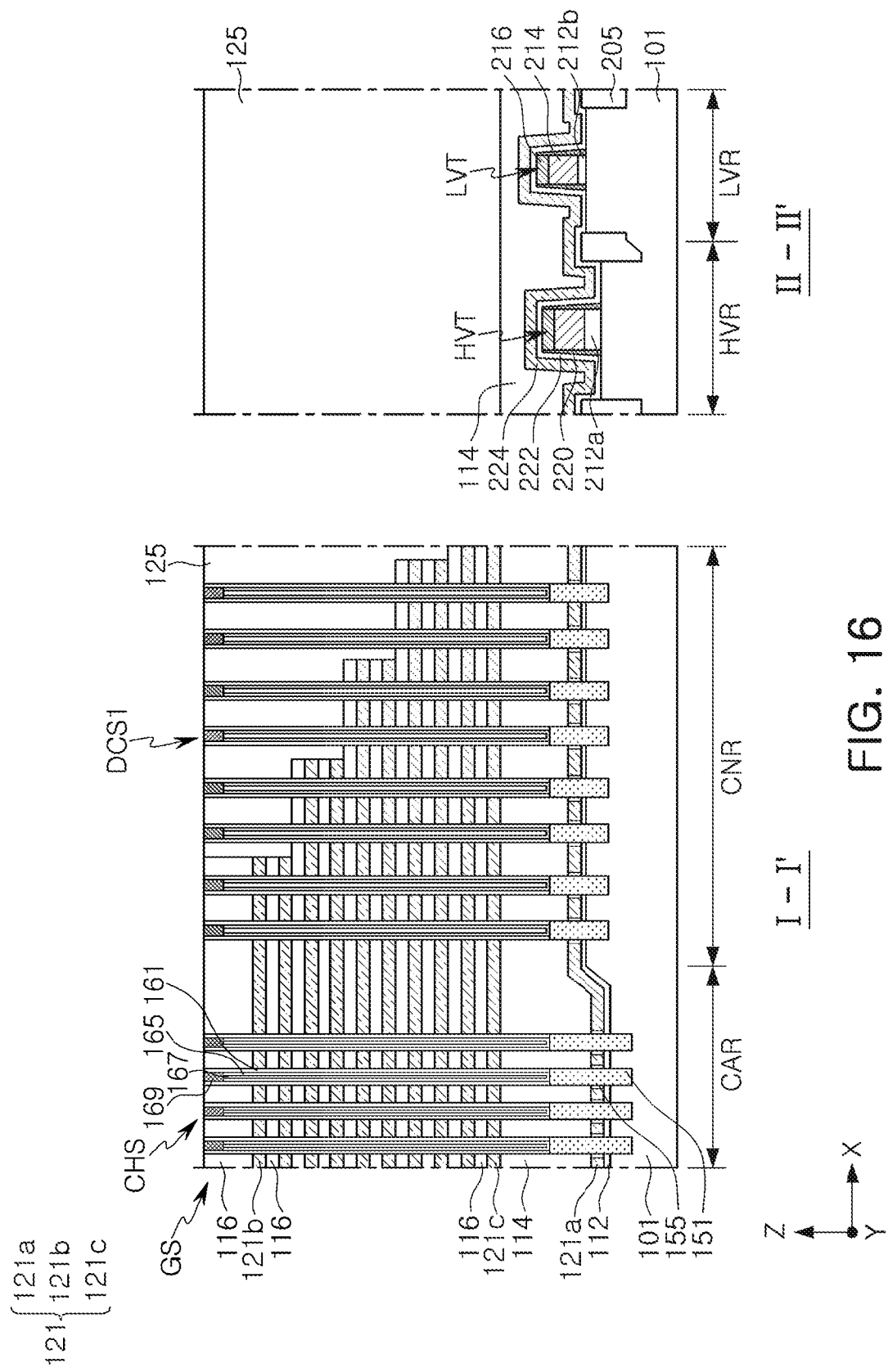

Referring to FIG. 16, channel structures CHS may be formed in the cell array region CAR, and first dummy channel structures DCS1 may be formed in the connection region CNR.

First, channel holes may be formed in the cell array region CAR and dummy channel holes may be formed in the connection region CNR by an anisotropic etching process. The channel holes and the dummy channel holes may pass through the mold insulating layers 116, the sacrificial layers 121, the first interlayer insulating layer 114, and the like, to expose the substrate 101.

Next, epitaxial layers 151 may be formed in lower portions of the channel holes and in lower portions of the dummy channel holes. The epitaxial layers 151 may be formed by performing selective epitaxial growth (SEG), by using the substrate 101 as a seed. The epitaxial layers 151 may be formed of a semiconductor material such as silicon or the like. The epitaxial layers 151 may be doped with impurities. Doping of the impurity may be performed during the selective epitaxial growth process. The impurity may be an impurity of the same conductivity type as the impurity in the substrate 101, or an impurity of the opposite conductivity type. The epitaxial layers 151 may be grown heteroepitaxial or homoepitaxially. The epitaxial layers 151 may include germanium and/or carbon. However, inventive concepts are not limited thereto.

Gate dielectric layers 161 may be formed to cover sidewalls of the channel holes and the dummy channel holes. The gate dielectric layer 161 may include a blocking layer, a charge storage layer, and a tunneling layer, formed sequentially. The gate dielectric layer 161 may be formed by a deposition process.

Channel layers 165 may be formed to cover the gate dielectric layer 161, in the channel holes and the dummy channel holes. The channel layers 165 may be formed of a semiconductor material such as polycrystalline silicon or amorphous silicon.

Insulating layers 167 may be formed to fill the remaining space of the channel holes and the dummy channel holes. Contact pads 169 may be formed on the channel layers 165. The insulating layers 167 may be formed of an insulating material such as silicon oxide or the like. The contact pads 169 may be formed using a doped semiconductor material.

Referring again to FIG. 4, after the sacrificial layers 121 are removed from the cell array region CAR and the connection region CNR by a wet etching process, the gate electrode layers 131 may be formed. Before the gate electrode layers 131 are formed, insulating layers 155 may first be formed on sidewalls of the epitaxial layers 151 by an oxidation process.

Figure 17:
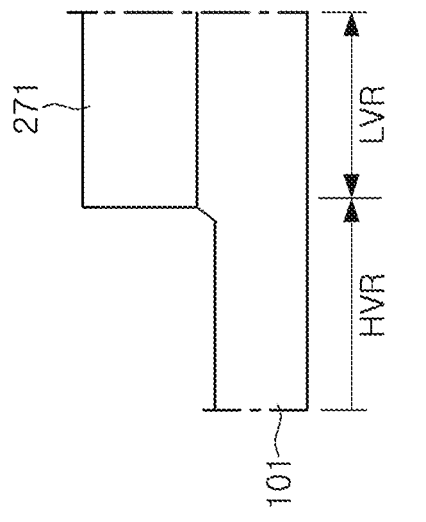
FIGS. 17 to 19 are schematic views illustrating a method of manufacturing a vertical-type memory device according to some example embodiments of inventive concepts.
Figure 18:
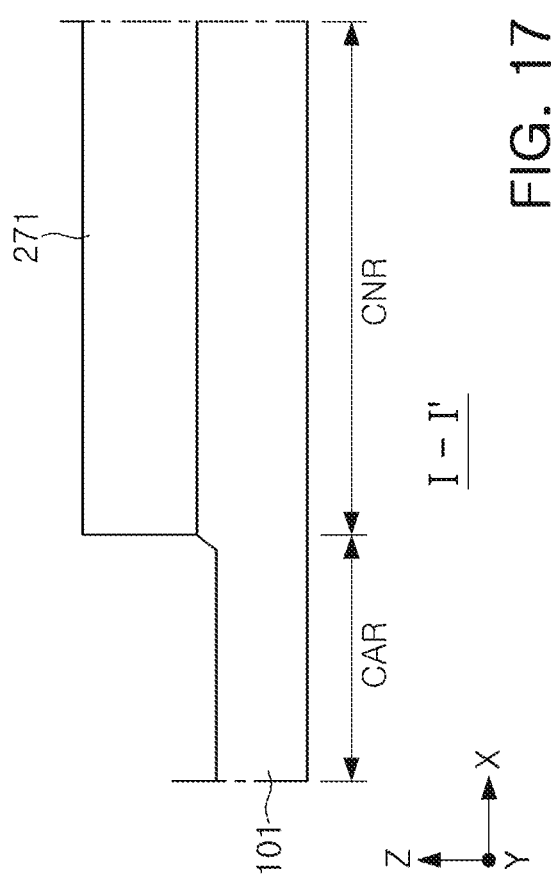
Figure 19:
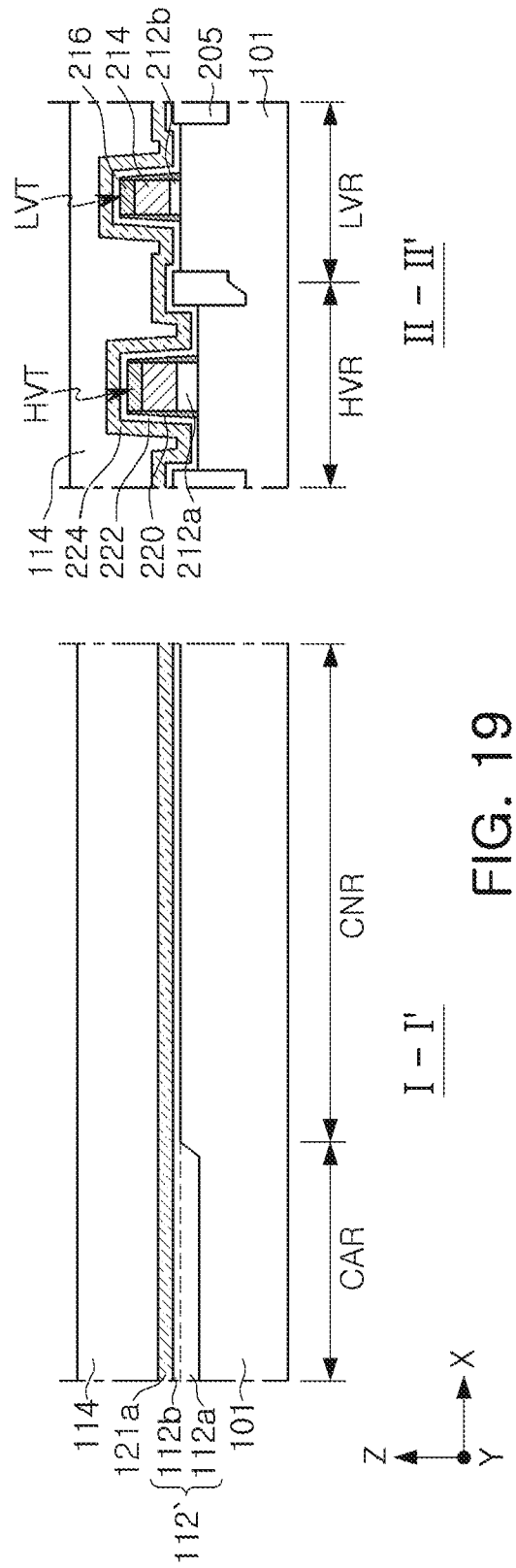

FIGS. 17 to 19 are schematic views illustrating a method of manufacturing a vertical-type memory device 10B according to some example embodiments.

Referring to FIG. 17, a cell array region CAR and a high voltage region HVR of a substrate 101 may be partially removed.

After a mask pattern 271 is formed to only expose the cell array region CAR and the high voltage region HVR, an etching process may be performed. The mask pattern 271 may be or include a photoresist pattern, and may be removed after the etching process is completed. In this process, a step portion may be formed on an upper surface of the substrate 101 at a boundary between the cell array region CAR and the connection area CNR. An upper surface of the substrate 101 in the cell array region CAR may be located on a lower level than an upper surface of the substrate 101 in the connection region CNR. In this process, a step portion may be formed on an upper surface of the substrate 101 at a boundary between the high voltage region HVR and a low voltage region LVR. The upper surface of the substrate 101 in the high voltage region HVR may be located on a lower level than the upper surface of the substrate 101 in the low voltage region LVR.

A height of the step portion formed on the upper surface of the substrate 101 at the boundary between the cell array region CAR and the connection region CNR may be the same as a height of the step portion formed on the upper surface of the substrate 101 at the boundary between the high voltage region HVR and the low voltage region LVR.

Referring to FIG. 18, a high voltage transistor HVT and a low voltage transistor LVT may be formed in the high voltage region HVR and the low voltage region LVR of the substrate 101, respectively. A first buffer insulating layer 112a may be formed in the cell array region CAR of the substrate 101.

The high voltage transistor HVT may include a high voltage gate insulating layer 212a and a gate electrode 214, and the low voltage transistor LVT may include a low voltage gate insulating layer 212b and a gate electrode 214. A capping layer 216 may be on the gate electrode 214, and a spacer 220 may be on a sidewall of the gate electrode 214.

The first buffer insulating layer 112a may be formed simultaneously in a process of forming the high voltage gate insulating layer 212a. Forming the high voltage gate insulating layer 212a and the first buffer insulating layer 112a may include a process of oxidizing the substrate 101, e.g. thermally oxidizing the substrate 101.

Referring to FIG. 19, a second buffer insulating layer 112b and a lowermost sacrificial layer 121a may be formed on the cell array region CAR and the connection region CNR of the substrate 101. The second buffer insulating layer 112b may form a buffer insulating layer 112' together with the first buffer insulating layer 112a. A first insulating layer 222 and a second insulating layer 224 may be formed on the high voltage region HVR and the low voltage region LVR of the substrate 101. Next, a first interlayer insulating layer 114 may be formed to cover the lowermost sacrificial layer 121a and the second insulating layer 224. The first interlayer insulating layer 114 may be formed of a material having etch selectivity with respect to the lowermost sacrificial layer 121a. Forming the first interlayer insulating layer 114 may include a process of depositing a silicon oxide film on the substrate 101, and a planarization process, for example, a chemical mechanical polishing (CMP) process. A height of the first interlayer insulating layer 114 may be adjusted to prevent or reduce the likelihood of the second insulating layer 224 from being exposed.

Next, the processes described above with reference to FIGS. 13 and 14 may be performed.

Referring again to FIG. 8, after the sacrificial layers 121 are removed from the cell array region CAR and the connection region CNR by a wet etching process, the gate electrode layers 131 may be formed. Before the gate electrode layers 131 are formed, insulating layers 155 may first be formed on sidewalls of epitaxial layers 151 by an oxidation process.

As set forth above, according to example embodiments, as upper surfaces of epitaxial layers are stably formed to be higher than an upper surface of a ground select line, a lowermost gate electrode layer, a vertical-type memory device having improved characteristics of leakage current through a dummy channel structure in a connection region and having improved reliability may be obtained.

While example embodiments have been shown and described above, it will be apparent to those skilled in the art that modifications and variations could be made without departing from the scope of inventive concepts as defined by the appended claims.

What is claimed is:

1. A vertical-type memory device comprising:
   a substrate including a cell array region and a connection region adjacent to the cell array region;
   a plurality of gate electrode layers stacked on the cell array region and the connection region of the substrate, and having a stepped shape in the connection region sequentially descending toward the connection region from the cell array region;
   a plurality of channel structures in the cell array region, the plurality of channel structures passing through the plurality of gate electrode layers, wherein each of the plurality of channel structures includes a first epitaxial layer in contact with the substrate, and a first channel layer on and contacting the first epitaxial layer;
   a plurality of dummy channel structures in the connection region, the plurality of dummy channel structures passing through at least one of the plurality of gate electrode layers,
   wherein each of the plurality of dummy channel structures includes a second epitaxial layer in contact with the substrate, and a second channel layer on and contacting the second epitaxial layer;
   a first interlayer insulating layer; and
   a second interlayer insulating layer,
   wherein an upper surface of the substrate has a first upper surface in the cell array region and a second upper surface disposed at a higher level than the first upper surface of the substrate in the connection region,
   at least one of the plurality of gate electrodes has a same level in the cell array region as in the connection region,
   the plurality of gate electrode layers includes a first gate electrode layer adjacent to the substrate and a second gate electrode layer adjacent to the first gate electrode layer,
   the first interlayer insulating layer is between the first gate electrode layer and the substrate,
   the second interlayer insulating layer is between the first gate electrode layer and the second gate electrode layer,
   an upper surface of each of the first and the second epitaxial layers is at a lower level than a lower surface in the cell array region of the second gate electrode layer,
   a distance between an upper end of the first channel layer and a lower end of the first channel layer is greater than a distance between an upper end of the first epitaxial layer and a lower end of the first epitaxial layer, and
   a distance between an upper end of the second channel layer and a lower end of the second channel layer is greater than a distance between an upper end of the second epitaxial layer and a lower end of the second epitaxial layer.

2. The vertical-type memory device of claim 1, wherein a thickness of the second interlayer insulating layer in the cell array region is greater than a thickness of the second interlayer insulating layer in the connection region.

3. The vertical-type memory device of claim 1, wherein a thickness of the first interlayer insulating layer in the cell array region is greater than a thickness of the first interlayer insulating layer in the connection region.

4. The vertical-type memory device of claim 1, wherein the first gate electrode layer comprises a bent portion bent along the upper surface of the substrate; and
   a first interval between the lower surface of the second gate electrode layer in the cell array region and an upper surface of the first gate electrode layer in the cell array region is greater than a second interval between the lower surface of the second gate electrode layer in the connection region and the upper surface of the first gate electrode layer in the connection region.

5. The vertical-type memory device of claim 1, further comprising contact plugs,
   wherein the first gate electrode layer comprises a pad region in the connection region,
   wherein the contact plugs comprise a contact plug on the pad region of the first gate electrode layer,
   wherein the second gate electrode layer comprises a first portion in the cell array region and a second portion in the connection region, and
   wherein the pad region of the first gate electrode layer is at a lower level than the first portion of the second gate electrode layer.

6. The vertical-type memory device of claim 1, wherein the second gate electrode includes an end portion in the connection region, and the end portion of the second gate electrode layer in the connection region is at a same level as a portion of the second gate electrode in the cell array region.

7. The vertical-type memory device of claim 1, wherein a vertical length of the plurality of channel structures is greater than a vertical length of the plurality of dummy channel structures.

* * * * *